United States Patent [19]

Kim et al.

[11] Patent Number: 5,680,410
[45] Date of Patent: Oct. 21, 1997

[54] MODIFIED SEMICONDUCTOR LASER DIODE HAVING AN INTEGRATED TEMPERATURE CONTROL ELEMENT

[76] Inventors: Yoon-Ok Kim, Am Heedbrink 21, D-44369 Dortmund; Ralph Pries, Weisse Taube 40, D-44369 Dortmund; Dae-Hin Yoon, Villigsterstrasse 41, D-58239 Schwerte, all of Germany

[21] Appl. No.: 424,399
[22] PCT Filed: Oct. 25, 1993
[86] PCT No.: PCT/DE93/01013
§ 371 Date: Jun. 22, 1995
§ 102(e) Date: Jun. 22, 1995
[87] PCT Pub. No.: WO94/10728
PCT Pub. Date: May 11, 1994

[30] Foreign Application Priority Data

Oct. 24, 1992 [EE] Estonia .............. 42 35 768.3

[51] Int. Cl.$^6$ .............. H01S 3/04
[52] U.S. Cl. .............. 372/34; 372/36
[58] Field of Search .............. 372/34–36

[56] References Cited

U.S. PATENT DOCUMENTS

| 4,338,577 | 7/1982 | Sato et al. | 372/36 |
| 5,042,042 | 8/1991 | Hori et al. | 372/34 |
| 5,499,258 | 3/1996 | Kawano et al. | 372/34 |

FOREIGN PATENT DOCUMENTS

| 59-022381 | 4/1984 | Japan . |
| 59-022382 | 4/1984 | Japan . |

OTHER PUBLICATIONS

Wittke et al "Stabilization of CW Injection Lasers"; RCA Technical Notes, TN No.: 1005, 3 sheets, Apr. 9, 1975.

Primary Examiner—Leon Scott, Jr.
Attorney, Agent, or Firm—Antonelli, Terry, Stout & Kraus, LLP

[57] ABSTRACT

Disclosed is an operational-temperature-stabilized wavelength-stabilized laser diode having an integrated temperature control unit. Such diode arrangement has combinations of the following features: at least one laser chip; heating provided by at least one PTC resistor such that a device operational temperature is controlled by this PTC resistor; a detector for determining the radiation emerging from the rear of the laser chip; an NTC resistor or a thermo-element for measuring the chip temperature. The laser chip serves a dual function of acting as a laser source and as a radiation detector, thereby eliminating any need for a separately provided radiation detector and resulting in a compact device. All the components required for temperature control, respectively, temperature stabilization, are miniaturized and integrated with the laser chip within a housing. The extremely small size of the invented laser diode opens a wide range of possible applications.

16 Claims, 1 Drawing Sheet

MODIFIED SEMICONDUCTOR LASER DIODE HAVING AN INTEGRATED TEMPERATURE CONTROL ELEMENT

DESCRIPTION

1. Technical Field

The present invention relates to an operational temperature stabilizing respectively wavelength stabilizing semiconductor laser diode having an integrated temperature control element.

2. State of the Art

Conventional semiconductor laser diodes have been known since as early as 1962 when two research groups demonstrated GaAs laser diodes independently of one another yet practically at the same time. However, it took a long time to turn the first laser diodes, still requiring nitrogen cooling, into devices capable of solving the simple-looking task of emitting a continuous laser beam at room temperature.

The rate of development of the diode laser sped up tremendously during the last 15 years, and laser diodes became one of the fastest developing laser technologies. On the one hand, this technology was stimulated by the spread of "fiber-optic communication" which required semiconductor light sources, and, on the other hand, the need for compact, inexpensive light sources in numerous data-processing applications. As a result, the quality of the offered laser diodes increased greatly, but also the demand therefor.

The wavelength (peak wavelength) emitted by a laser diode also depends very heavily on the operational temperature in addition to the operational current. (Unless specifically defined in a different manner hereinafter, the term "temperature" shall mean the operational temperature of the laser diode respectively of the laser chip.) Typical values of the temperature drift are about 0.25 nm/°C. in the case of GaAlAs laser diodes and about 0.5 nm/°C. in the case of InGaAsP laser diodes.

The matter becomes more complicated due to the fact that many diode lasers are able to oscillate simultaneously in many different modes, each with a different wavelength. If the temperature changes, the laser, e.g., can jump from a longitudinal mode into another mode ("mode-hopping") and thereby abruptly alter its (peak) wavelength. This can occur if the pulse length changes during pulsed operation or if the operational current and starting power alter during the duration of operation.

An increase in the operational current can shift continuous wave laser diodes from a multi-mode state to a state which is strongly dominated by a single mode. The entire problem can become very complicated due to the fact that the emitted wavelength can gradually change and then jump abruptly to another value. This behavior can cause frequency instabilities and/or temperature changes as well as an increase in noise at the mode-hopping points.

In the case of applications that require wavelength stability, active temperature control that maintains the laser diodes at a fixed temperature can therefore contribute to minimizing many of the aforementioned problems.

DESCRIPTION OF THE INVENTION

The object of the present invention is, for wavelength stabilization and/or power stabilization, to build a laser diode the operational temperature of which is maintained at a fixed value that the user can set by means of active temperature control.

As the advantage of the compact construction of conventional laser diodes should be retained in any event, the present invention has, i.a., the object to make smaller respectively miniaturize and integrate all the components required for temperature control next to the laser chip in a usual-sized housing.

According to the state of the art, achieving temperature stabilization of laser diodes is usually attempted by means of suited cooling. Examples deserving mention herein are for instance

- air cooling and simultaneously employing cooling bodies ("heat sinks") with large surfaces (if need be assisted by fans),
- cooling with liquid nitrogen or
- cooling with Peltier elements (which is predominantly used today).

The present invention is based on it being strikingly understood that a suited temperature control of the laser diode or better said of the laser chip can also be attained by using thermistors. In particular, this occurs by employing posistors ("PTC resistors" or "PTCs" short) utilized as heat and/or control elements.

When using PTCs as heating elements, the temperature of the laser chip is "heated" to a value above the ambient temperature. This temperature value can, i.a., not be reached solely by heating the laser chip by means of the flow of the operational current.

Due to their special, known characteristic, PTCs can also be utilized as control elements. In this event, the laser chip heats the PTC to its operational temperature whereas the PTC only serves to control this temperature.

DESCRIPTION OF A PREFERRED EMBODIMENT

Figure 1A:
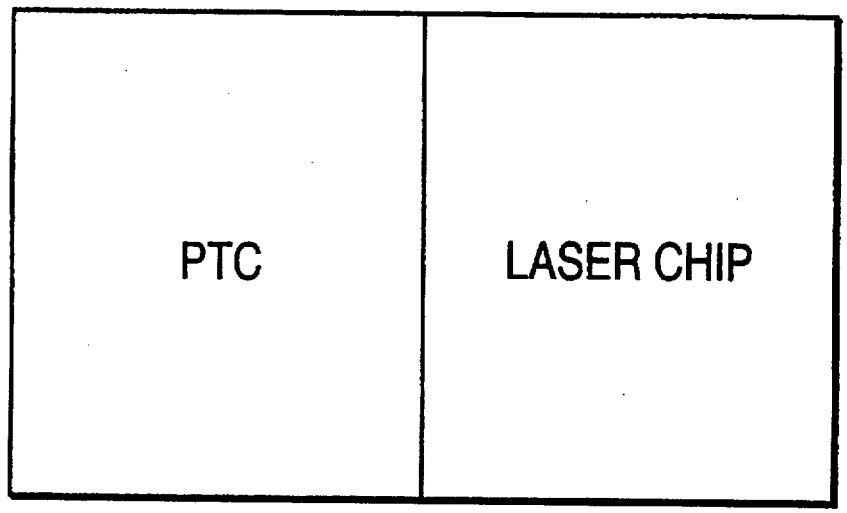
FIG. 1(a) is a schematic view of a laser chip in electrical and thermal contact with a PTC so as to form one unit therewith.

An element of the present invention is that a miniaturized PTC is brought into thermal contact with the laser chip as shown in FIG. 1(a). In comparison to conventional laser diodes, the PTC replaces the employed "mounting column" on which the laser chip usually is mounted and which usually acts as a heat sink.

In addition to suited thermo-elements (e.g., NiCr-Ni), in particular, miniaturized heating conductors (also called "NTC-resistors" or short "NTC") serve to measure the temperature. Due to their small mass, the latter can measure very quickly respectively almost lag-free. If need be, an NTC can be brought within the region of the laser chip or mounted directly onto it. Furthermore, if need be, NTCs can be disposed on the PTC, the buffer (see below) and (if the buffer and housing are thermally insulated from each other) on the housing.

Figure 1B:
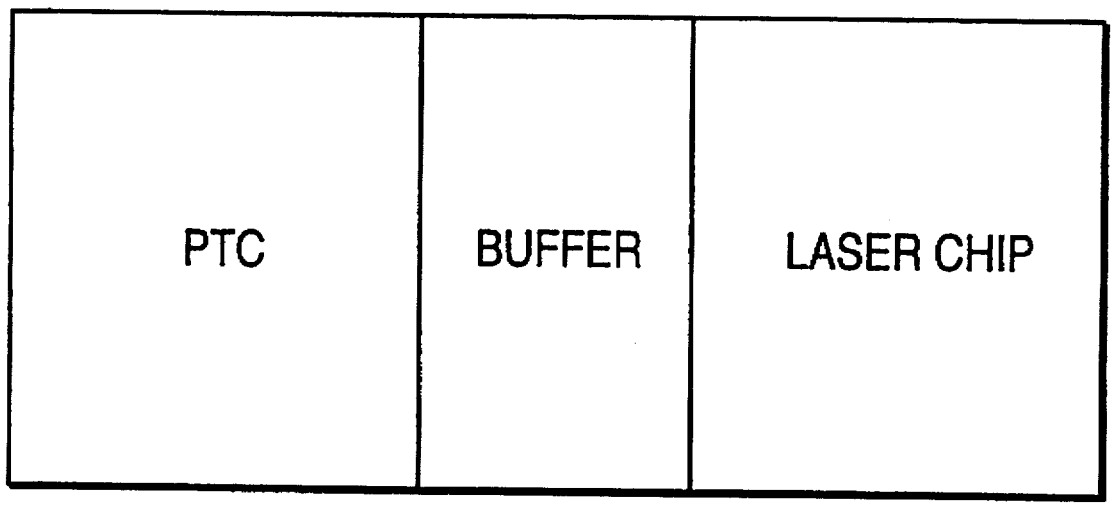
FIG. 1(b) is a schematic view of a laser chip and a PTC with a buffer of a material with a suitable thermal conductivity being located therebetween.

If need be, a suited buffer is disposed between the PTC and the laser chip as shown in FIG. 1(b). For instance, a metal disk the size of which, i.a., lies between the size of the PTC and the laser chip can serve as a buffer.

The said buffer may also be designed in such a manner that it simultaneously serves as a carrier which permits mounting the laser chip and the miniaturized PTC. Buffers respectively carrier material should be in thermal equilibrium with the laser chip and the PTC.

The laser chip temperature, PTC temperature and housing/buffer temperature can be set highly stabilized via special activation electronics.

In order to set a specific temperature equilibrium between the laser chip, the PTC and the housing, the procedure is, i.a., as follows: first the PTC is heated and then the operational current (forward current) of the laser diode is switched on with a settable time-lag. However, the reverse procedure is also possible. First the operational current of the laser diode is switched on accordingly and then with a delay the PTC heating.

In addition, a suited photodiode can be mounted in the region of the beam emerging from the rear of the laser chip. However, in contrast to conventional laser diodes, this is not necessarily within the scope of the present invention for the control of the optical starting power, because the laser chip can be used both as a radiation detector and as a temperature sensor.

The current from the photodiode can also be employed for either controlling the temperature or for controlling the optical starting power of the laser diode.

The relationship between the change in the optical starting power of the laser diode and the current generated by the photodiode can also be used for measuring respectively calibrating the relative temperature.

Furthermore, the invented apparatus, depending on the application, may contain windows, filters or special lenses (systems), such as, e.g., gradient index lenses.

All the components mentioned in the preceding are accommodated, within the scope of the present invention, in a housing the size of which corresponds to the standard housing employed today. If the windows, filters or lenses mentioned in the preceding are utilized, the housing is simultaneously hermetically blocked thereby.

If need be, for the protection of the laser chip against undesirable oxidation, the housing also contains inert gases.

If need be, the housing of the modified laser diode may be pleated respectively provided with slits or ribs in order to enlarge the surface and therefore to cool it.

For special applications, several laser chips may also be disposed on a PTC, respectively a laser chip between two or more PTCs. Simultaneous use of PTCs and miniaturized Peltier elements is also possible.

The invented modified laser diode can work both in continuous wavelength as well as in pulsed operation. In the latter instance, pulsed operation is begun after a specific time $t_x$ (warming up period). During the pulse period $t_p$, the optical starting power of the laser chip reaches, beginning at zero or at a level differing from zero, a maximum value and then drops back to zero or a power level differing from zero. Hereinafter the mean optical starting power during the time $t_p$ is referred to as the pulse height $I_p$. In order to achieve a power level corresponding to the defined pulse height $I_p$, the operational current of the laser diode is raised during the time $t_p$ to a specific maximum $S_{max}$ from which it subsequently drops to zero ($S_o$) or a value $S_{min}$ differing from zero. $s_{min}$ usually lies in the range of the threshold current $S_{th}$ of the laser diode.

Hitherto, in order to achieve temperature equilibrium between the laser chip, PTC and buffer/housing, it is advantageous not to heat the PTC continuously but rather also pulse-like. The rise in temperature with the constant current s is checked in this manner, in particular, by cooling the PTC in the pauses between two heating intervals. Heating intervals and heating pauses may be selected in such a manner that the pulsed laser diode emits its pulses within the heating pauses of the PTC. The influence of the fluctutations of the stabilized PTC temperature is thus discontinued and eliminated during laser diode operation period.

The invented laser diode can be used in all fields of application in which laser diodes are presently employed. The inclusion of the laser chip and temperature control element in a single as integrated as possible component opens numerous new possible applications.

In particular, the invented laser diode finds application where the highest degree in wavelength stability is demanded. This is, i.a., the case when the laser diodes are employed for specific analyses, such as , e.g., utilization in the analysis of human tissue, in particular, in in-vivo examination of body fluids as well as especially in the analysis of the substances of human blood (blood glucose, cholesterol, alcohol, etc.).

The invented modified laser diode is particularly suited for use as a radiation source in a device for qualitative and/or quantitative analysis of a to-be-analyzed sample according to DE patent application P 42 27 813.9 which for its part is primarily employed in noninvasive analysis of the substances of human blood (blood gluconse, etc.)

Analyses such as, e.g., within the scope of the latter application require highly accurate and randomly repeatable calibration of the measuring device. The invented radiation source permits this simultaneously applying the following method:

For calibration purposes, the pulse height of the optical output power of the invented laser diode can be altered in the following manner in pulsed operation. A train of n pulses is comprised into a sequence for which the following holds: the first pulse of this sequence possesses a pulse height of $I_{p1}=I_{max}=100\%$. The second pulse possesses a pulse height of pulse height $I_{p2}<I_{max}$. For the third pulse holds $I_{p2}>I_{p3}>I_{p4}$, etc. for the nth pulse holds $I_{pn-1}<I_{pn}<I_{min}$. After the run of a sequence of n pulses $I_{p1}$ to $I_{pn}$, the next sequence again begins with $I_{p1}$. Within a sequence of pulses, the parameters are measured for each pulse height relevant to the respective measurement, in particular however also the temperatures of the laser chips $T_{LD}$, of the PTC $T_{PTC}$ and of the housing $T_G$. The differences $\delta X_{pi}$ of the measured values $X_i$ of all the relevant measured magnitudes X at $I_{pi}$ and at $I_{min}$ are utilized for calibration (analysis). This occurs in that the $\delta X_{pi}$ are plotted on the $I_{p1}$ and the thereby yielded n points and a balance function is gained with the aid of linear regression. This process has the advantage that only one sample is required for calibration (single probe calibration). In order to increase the reliability of the calibration, it should be possible to dilute or enrich the analysis probe. —In the event, the concentration of glucose in human blood is to be determined, a specific personal calibration curve for a patient can be plotted, by way of illustration, by only taking a single blood sample.

Furthermore, measurement occurs in the region of the middle of the calibration curve, because the measurement error due to the mathematics of the linear regression is least there. The middle is also far enough from the background (noise) in order to avoid its disturbing influence.

The combination of several personal (patient-related) calibration curves, while employing the said mathematical operations, permits determination of a patient-independent calibration curve. On the other hand, with this aid of the latter calibration curve more reliable and more accurate personal calibration curves can be plotted.

A recalibration sample is yielded, e.g., in the following manner: synthetic material (e.g., cardboard) can be found which produce the same $\delta X_{pi}$ at certain $I_{pi}$ like a certain concentration of a selected material (e.g., glucose) in a to-be-analyzed sample. This permits random recalibration of the measurement device when measuring with, e.g., a suited calibration cardboard, because in this case the calibration cardboard assumes the role of the sought material. Thus, a calibrated sample-free calibration or in other words an indirect calibration process is yielded.

What is claimed is:

1. A laser diode comprising an integrated temperature control unit provided with at least one laser light generating laser chip which is heated by at least one positive temperature coefficient (PTC) resistor, such PTC resistor being thermally connected with said laser chip in such a manner that an operational temperature of said laser chip is set by thermal conduction to an operating temperature of said PTC resistor, wherein said laser chip, by measuring, a change in voltage across said laser chip, operates as a radiation detector for detecting radiation emitted by said chip.

2. An apparatus according to claim 1, wherein said laser chip, by measuring a change in voltage occurring across said later chip during a temperature change, operates as a temperature sensor.

3. An apparatus according to claim 1 or 2, further comprising at least one miniaturized Peltier element which is in thermal contact with said laser chip.

4. An apparatus according to claim 3, further comprising a buffer made of a material having a thermal conductivity, said buffer being attached to and located between said laser chip and said Peltier element.

5. An apparatus according to any one of claim 1, 2 or 3, wherein measurement of a current generated by said radiation detector and a predetermined relationship between a change in optical output power of said laser diode and a current generated by said radiation detector, is utilized for relative temperature measurement for setting a temperature of said laser diode.

6. An apparatus according to claim 1, further comprising a buffer made of a material having a thermal conductivity, said buffer being located between said laser chip and said PTC resistor.

7. An apparatus according to claim 6, wherein said buffer acts as a support permitting attachment of said laser chip and said PTC resistor.

8. An apparatus according to claim 6, wherein said buffer forms an integral part of a housing of said laser diode.

9. An apparatus according to claim 1, further comprising at least one of a negative temperature coefficient (NTC) resistor and a thermo-element being disposed proximate to said laser chip for measurement of an operational temperature of said laser chip.

10. An apparatus according to claim 1, further comprising at least one of a negative temperature coefficient (NTC) resistor and a thermo-element being disposed proximate to said PTC resistor for measurement of a working temperature of said PTC resistor.

11. An apparatus according to claim 1, further comprising at least one radiation detector disposed proximate to said laser chip for detecting radiation emitted from said laser chip.

12. An apparatus according to claim 1, further comprising a laser diode housing and miniaturized circuit components for temperature control within said housing.

13. An apparatus according to claim 12, wherein a size of said housing is a predetermined standard housing of a type $\phi$ 9 mm "standard package" or of a type $\phi$ 5.6 mm T.O. 18 or smaller.

14. An apparatus according to claim 12, wherein said housing further comprises optical components for allowing laser light generated by said laser chip to be output from said housing.

15. An apparatus according to claim 12, wherein said housing being hermetically sealed.

16. An apparatus according to claim 12, wherein said housing being pleated with slits or ribs in order to enlarge a surface thereof for cooling.

* * * * *